(12) United States Patent
Takahashi et al.

(10) Patent No.: US 7,050,323 B2
(45) Date of Patent: *May 23, 2006

(54) FERROELECTRIC MEMORY

(75) Inventors: Hiroshi Takahashi, Tsukuba (JP); Osamu Handa, Tokyo (JP); Rimon Ikeno, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/917,777

(22) Filed: Aug. 12, 2004

(65) Prior Publication Data

US 2005/0030782 A1   Feb. 10, 2005

Related U.S. Application Data

(62) Division of application No. 10/230,574, filed on Aug. 29, 2002, now Pat. No. 6,778,422.

(51) Int. Cl.
*G11C 11/22* (2006.01)

(52) U.S. Cl. ............... 365/145; 365/154; 365/205; 365/149; 365/174

(58) Field of Classification Search ............ 365/145, 365/154, 205, 149, 174
See application file for complete search history.

(56) References Cited

U.S. PATENT DOCUMENTS

| | | | |
|---|---|---|---|
| 3,158,842 A | 11/1964 | Anderson | |
| 4,144,591 A | 3/1979 | Brody | |
| 4,300,212 A | 11/1981 | Simko | |
| 4,499,560 A | 2/1985 | Brice | |
| 4,506,349 A * | 3/1985 | Mazin et al. | 365/189 |
| 4,546,455 A * | 10/1985 | Iwahashi et al. | 365/200 |
| 4,630,238 A | 12/1986 | Arakawa | |
| 4,743,784 A * | 5/1988 | Obara et al. | 307/530 |
| 4,796,227 A * | 1/1989 | Lyon et al. | 365/154 |
| 4,809,225 A | 2/1989 | Dimmler et al. | |
| 4,839,862 A * | 6/1989 | Shiba et al. | 365/154 |
| 5,048,023 A * | 9/1991 | Buehler et al. | 371/40.01 |
| 6,778,422 B1 * | 8/2004 | Takahashi et al. | 365/145 |
| 6,898,107 B1 * | 5/2005 | Kang | 365/145 |

FOREIGN PATENT DOCUMENTS

| | | |
|---|---|---|
| DE | 27 54 987 A1 | 9/1977 |
| JP | 60-31665 | 2/1985 |
| JP | 02001033986 | 6/1993 |
| JP | 2000299742 | 9/2000 |

OTHER PUBLICATIONS

"Static RAM with Nonvolatile Backup Memory", Electronic Devices Memories YSY, IBM Technical Disclosure Bulletin, vol. 24, No. 5, Oct. 1981, pp. 2456-2457.

* cited by examiner

*Primary Examiner*—Viet Q. Nguyen
(74) *Attorney, Agent, or Firm*—J. Dennis Moore; W. James Brady, III; Frederick J. Telecky, Jr.

(57) ABSTRACT

A nonvolatile memory cell in the form of an SRAM is composed of ferroelectric capacitors and transistors for amplification. The memory cell comprises a first capacitor (FC1) connected between a first terminal (ND1) and a common terminal (CP). A second capacitor (FC2) is connected between a second terminal (ND2) and the common terminal. A first transistor (N1) has a current path connected between the first terminal and a reference terminal (GND) and has a control terminal connected to the second terminal. A second transistor (N2) has a current path connected between the second terminal and the reference terminal and has a control terminal connected to the first terminal.

17 Claims, 5 Drawing Sheets

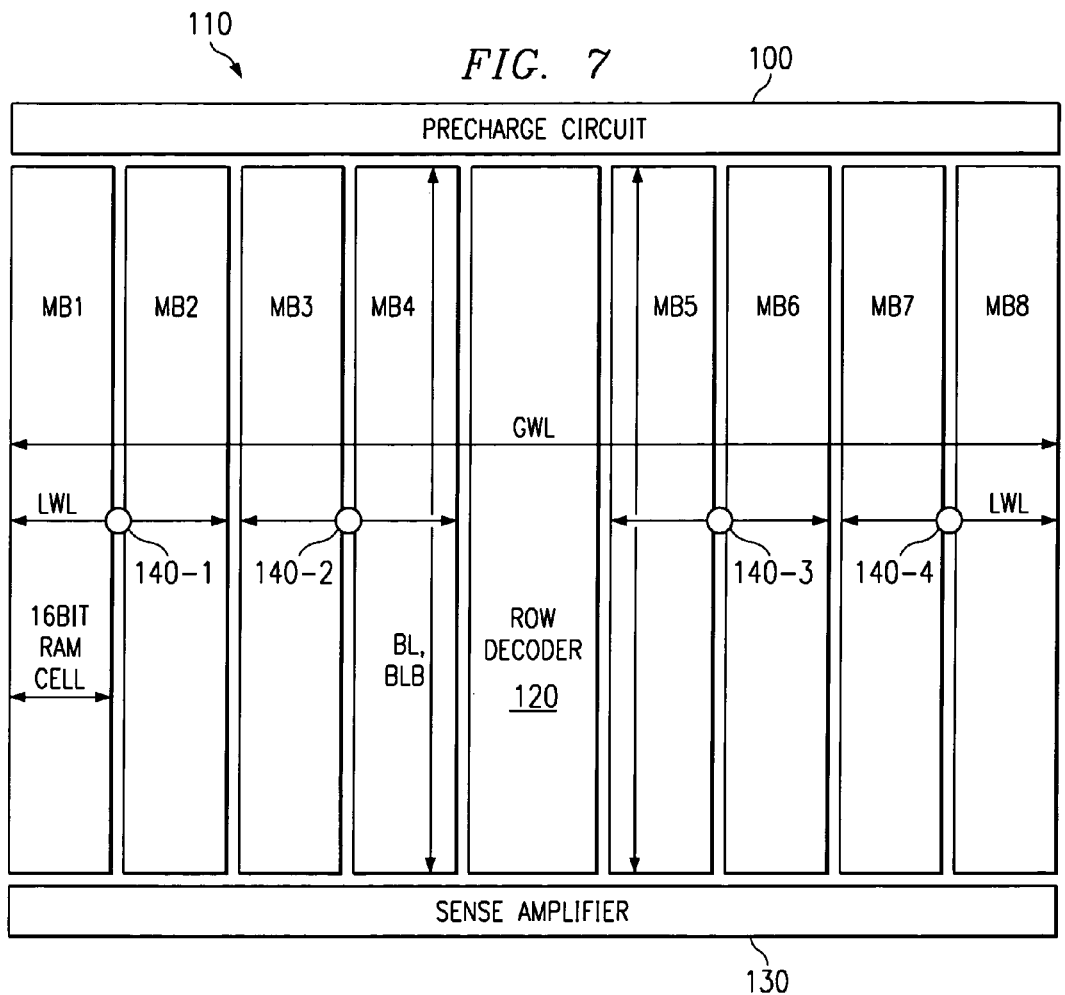
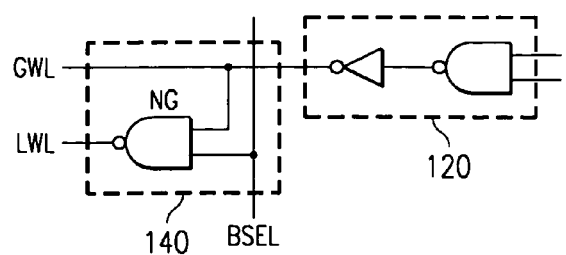

FERROELECTRIC MEMORY

This application is a division of application Ser. No. 10/230,574 now U.S. Pat. No. 6,778,442 filed on Aug. 29, 2002.

FIELD OF THE INVENTION

The present invention pertains to a ferroelectric memory that contains ferroelectric capacitors in a 4-transistor structure SRAM (Static Random-Access Memory).

BACKGROUND OF THE INVENTION

SRAMs have several advantages. For example, as long as the power source voltage is supplied, the written data do not disappear, and it allows high-speed write and read operations. Consequently, it is widely adopted in main memory, cache memory, etc. of computers that require high-speed data access.

Memory cells of the conventional SRAM include the so-called 6-transistor type made up of 6 transistors, the so-called 4-transistor type made of 4 transistors, etc. All of these types can realize high-speed access, and can hold the stored data with good stability.

In recent years, there has been significant progress in the development of more refined semiconductor manufacturing technology with higher density, and there has also been progress in the development of technology using lower power source voltage for reducing power consumption. However, along with this trend of smaller SRAM memory cells and lower power source voltage, new problems have arisen. In particular, in DSPs (Digital Signal Processors), for SRAMs carried together with other operation circuits or processing circuits on the same chip, that is, the so-called on-chip SRAM, the capacitance keeps rising. As the capacitance increases, the standby current (leakage current) becomes larger, which is undesirable.

In the SRAM memory cell, with a decrease in the power source voltage, the amount of charge that moves due to reading or writing of data decreases. Consequently, the data error rate (soft error rate, referred to as SER hereinafter) rises. In the design and manufacture of SRAMs, the following issues related to scale limitations must be addressed: the scale of the power source voltage, the scale of the charge storage node, and the scale of the memory cell. In addition, the requirement for correctness of the stored data is high. For example, for the instruction code that is stored in DSP program memory and that controls the operation of the processor of DSP, it is believed that even 1-bit data errors cannot be tolerated.

As a method for solving the problem related to increase in SER, one may introduce an error check and correction circuit (hereinafter referred to as an ECC circuit). For example, the vertical/horizontal parity system and Hamming code are effective means to correct single-bit soft data. However, ECC has the disadvantage of increased cost and decreased operating speed due to increase in area for redundancy bit and comparison correcting circuit. Consequently, there is a demand for the development of a method with little influence on the access speed, etc. While ECC is realized on the system level in the case of DRAM, DSP has the system already formed on the chip. Consequently, it is important to realize ECC at least in hardware.

In order to realize ECC, in addition to the conventional memory bit, it is necessary to have memory bits for storing codes for performing error detection and correction, and the number of memory bits inevitably increases. For example, when a vertical/horizontal parity system is used in a DRAM with a volume of 16 Mb, a 33-bit parity code is added for every 256 bits. Also, when a Hamming code system is used in DRAM with a volume of 16 Mb, an 8-bit redundancy code is added for every 128 bits. Usually, an increase in the area of about 20% is inevitable due to the ECC circuit. Also, an increase in the ECC circuit and memory cells leads to an increase in the leakage current of transistors that form inverters and transfer gates inside the memory cell. It is believed that because the standby current for the memory rises, ECC is undesirable from the standpoint of power consumption.

Several methods have been proposed to suppress the transistor leakage current. For example, by controlling the threshold voltage by means of the substrate bias or by lowering the power source voltage in standby by means of plural power source voltages, the leakage current is suppressed. In consideration of the variation in manufacturing transistors having a low threshold voltage, such as a threshold voltage of 0.2 V or lower, it is difficult to suppress the leakage current entirely on the mass production level. Consequently, in many proposed methods, transistors with a high threshold voltage are used in the SRAM portion, and transistors with low threshold voltage are used in the logic portion. That is, a dual-threshold voltage system is used. However, when transistors with different threshold voltages are manufactured, since the number of masks of the manufacturing process is increased and the number of implanting steps for control of threshold voltage is increased, the manufacturing cost is expected to increase, and, when high-threshold-voltage devices are used, the performance of the SRAM may degrade.

As a final method for suppressing the leakage current, one may make use of nonvolatile memories, such as ferroelectric memories, which can hold stored data, even when the power source voltage is stopped. However, at present, most of the efforts related to the development of ferroelectric memories are mainly performed with respect to studies on area, speed, and cost relative to DRAMs. For example, the following structures are often adopted: DRAM memory cell or other 1-capacitor/1-capacitor structure, 1-transistor/2-capacitor structure, and 2-transistor/2-capacitor structure. However, in almost all of the examples, memory cells do not have gain cells. Consequently, the operating speed is lower than that of the conventional SRAM.

The purpose of the present invention is to solve the aforementioned problems of the conventional methods by providing a type of ferroelectric memory characterized by the fact that 4 transistors and 2 ferroelectric capacitors are used to form an SRAM-structure ferroelectric memory cell; as a result, while high-speed access is realized, the SER can be improved, and it is possible to realize lower power consumption by means of lower power source voltage and stopping of the power source voltage in standby state.

SUMMARY OF INVENTION

In order to realize the aforementioned purpose, the present invention provides a type of ferroelectric memory characterized by the following facts: it has a first ferroelectric capacitor connected between a cell plate and a first node: a second ferroelectric capacitor connected between said cell plate and a second node: a first transistor that is connected between said first node and a reference potential and has its gate connected to said second node; a second transistor that is connected between said second node and the reference potential and has its gate connected to said first node; a third transistor that is connected between said first node and a bit line and has its gate connected to a word line; a fourth transistor that is connected between said second node and a complementary bit line and has its gate connected to said word line; a precharge circuit that precharges said bit line and said complementary bit line to a prescribed potential before the read operation; and a first voltage supply circuit that supplies a reference potential or a prescribed voltage to said cell plate; and, the reference potential is supplied to said cell plate when said first voltage supply circuit is in standby state.

Also, according to the present invention, it is preferred that said prescribed voltage be applied in pulse form to said cell plate when said first voltage supply circuit activates said word line.

Also, according to the present invention, it is preferred that it have a second voltage supply circuit that supplies the reference potential to said bit line and said complementary bit line in standby state.

BRIEF DESCRIPTION OF THE DRAWINGS

FIG. 7 is a diagram illustrating an example of layout of the memory array formed from ferroelectric memory cells of the embodiment.

FIG. 8 is a circuit diagram illustrating an example of the constitution of the local word line driver.

REFERENCE NUMERALS AND SYMBOLS AS SHOWN IN THE DRAWINGS

In the figures, 10 represents an input buffer, 20 a precharge circuit, 30 a memory cell, 40 a precharge circuit, 50 a sense amplifier, 60, 70 an output buffer, 100 a precharge circuit, 110 a memory block, 120 a row decoder, 130 a sense amplifier, 140 a local word line driver, CP a cell plate, FC1, FC2 a ferroelectric capacitor, WL a word line, GWL a global word line, LWL a local word line, BL a bit line, BLB a complementary bit line, $V_{DD}$ a power source voltage, and GND ground potential.

DESCRIPTION OF THE EMBODIMENTS

Figure 1:
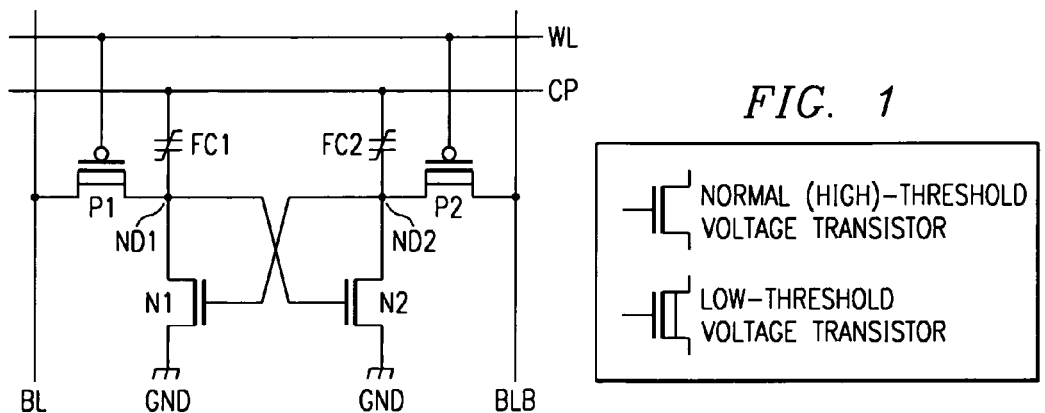
FIG. 1 is a circuit diagram illustrating an embodiment of the ferroelectric memory of the present invention. It shows the constitution of a ferroelectric memory cell.

FIG. 1 is a circuit diagram illustrating an embodiment of the ferroelectric memory of the present invention. It illustrates an example of the constitution of a memory cell of the ferroelectric memory.

As shown in the figure, the ferroelectric memory cell in this embodiment is composed of switching PMOS transistors P1 and P2, amplifying NMOS transistors N1 and N2, and ferroelectric capacitors FC1 and FC2.

Capacitor FC1 and NMOS transistor N1 are connected in series between cell plate CP and ground potential, with memory node ND1 formed at the middle connecting point. Transistor P1 is connected between node ND1 and bit line BL, and its gate is connected to word line WL.

Similarly, capacitor FC2 and NMOS transistor N2 are connected in series between cell plate CP and ground potential, with memory node ND2 formed at the middle connection point. Transistor P2 is connected between node ND2 and complementary bit line BLB, and its gate is connected to word line WL.

The gate of transistor N1 is connected to node ND2, and the gate of transistor N2 is connected to ND1.

As shown in FIG. 1 in the ferroelectric memory in this embodiment, a memory cell is composed of 4 transistors and 2 ferroelectric capacitors. In the case of memory access corresponding to the voltage applied to word line WL, switching transistors P1 and P2 are on, and a data write or read operation is performed with respect to the memory cell. For example, when a write is performed, the voltages are determined corresponding to the data written on bit line BL and complementary bit line BLB, respectively. Then, transistors P1 and P2 are turned on, so that voltages are set on memory nodes ND1 and ND2 corresponding to the write data, respectively. In addition, when a pulse signal is applied to cell plate CP, polarization is generated corresponding to the data written in capacitors FC1 and FC2. Even when the applied electric field disappears, the polarization is still left at a certain level. Consequently, the data written in ferroelectric capacitors FC1 and FC2 are held.

On the other hand, in read mode, at first, bit line BL and complementary bit line BLB are precharged to the power source potential. Then, word line WL is activated and transistors P1 and P2 are turned on, so that the precharge is re-distributed between bit line BL and memory node ND1 and between complementary bit line BLB and memory node ND2. At this time, because capacitors FC1 and FC2 are polarized in opposite directions, there is a difference in the effective capacitance between them. After re-distribution of the charge, a potential difference takes place between memory nodes ND1 and ND2. This difference in potential is amplified by cross-coupled transistors N1 and N2. Because this amplification operation supplements the amplification operation of the sense amplifier outside the memory cell, high-speed memory access is realized.

In the following, let's look at the operation of the ferroelectric memory in this embodiment with reference to the circuit diagram illustrating a portion of the circuit of the ferroelectric memory including ferroelectric memory cell as well as the precharge circuit, sense amplifier, etc.

Figure 2:
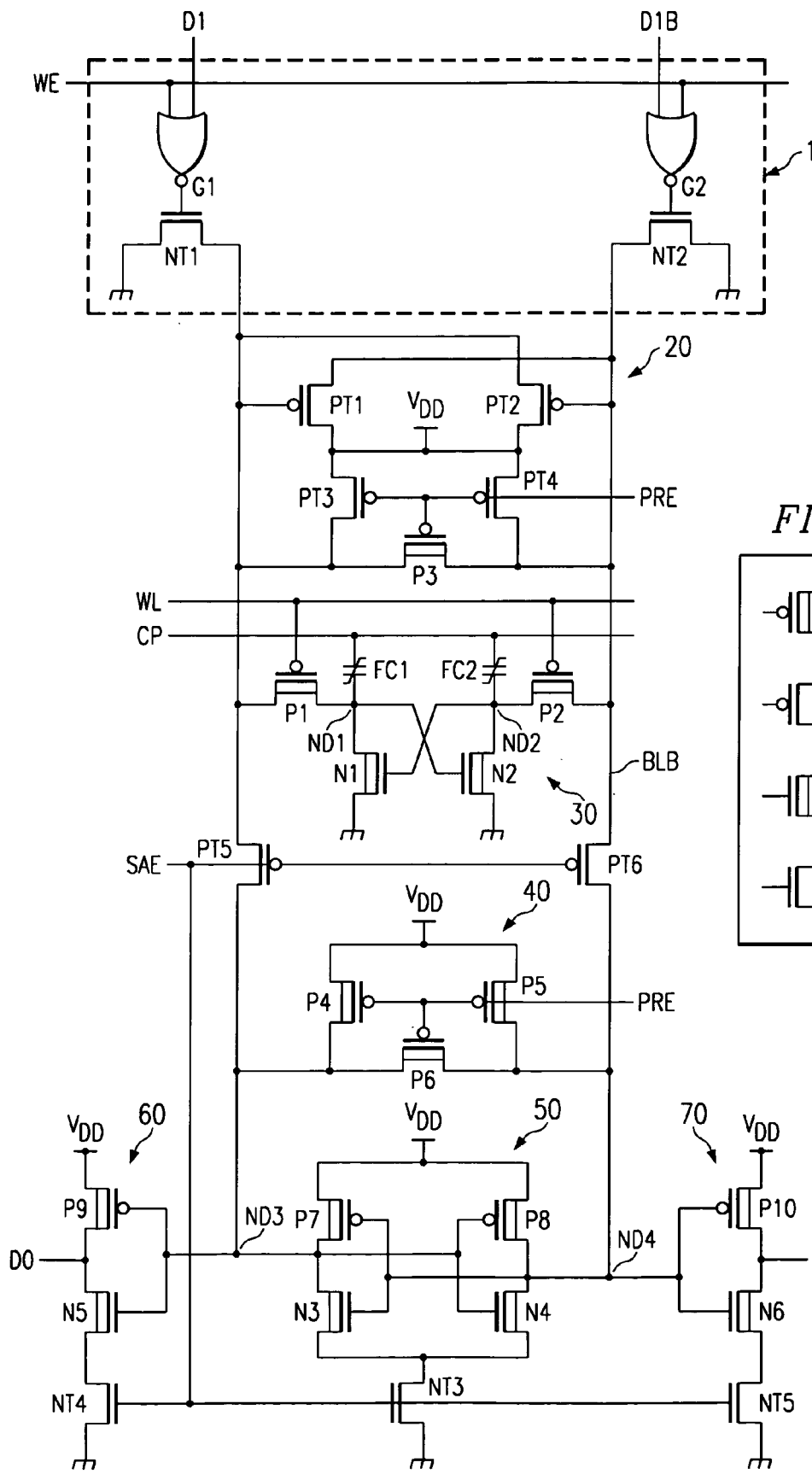
FIG. 2 is a circuit diagram illustrating a portion of the circuit of the ferroelectric memory containing ferroelectric memory cell of the present invention.

FIG. 2 is a circuit diagram illustrating part of the circuit of the ferroelectric memory containing input buffer 10, precharge circuit 20, memory cell 30, precharge circuit 40, sense amplifier 50 and output buffers 60 and 70. In a practical ferroelectric memory, however, a memory cell array is formed from plural ferroelectric memory cells arranged in a matrix.

As shown in FIG. 2, input buffer 10 is composed of NOR gates G1 and G2 and NMOS transistors NT1 and NT2. One of the input terminals of NOR gate G1 is connected to write enable signal line WE, while write signal DI corresponding to the write data is input to the other input terminal. One of the input terminals of NOR gate G2 is connected to write enable signal line WE, while write signal DIB corresponding to the write data is input to the other input terminal. Here, write signals DI and DIB are set at opposite logic levels corresponding to the write data.

Transistor NT1 is connected between bit line BL and ground potential GND, and its gate is connected to the output terminal of NOR gate G1. Transistor NT2 is connected between complementary bit line BLB and ground potential GND, and its gate is connected to the output terminal of NOR gate G2.

In write mode, write enable signal line WE is held at the low level, and, corresponding to input write signals DI and DIB, the output of either NOR gate G1 or NOR gate G2 is held at the high level, while the output of the other gate is held at the low level. Consequently, one of transistors NT1 and NT2 is turned on, and the other is turned off. Consequently, either bit line BL or complementary bit line BLB is held at the high level, such as power source voltage $V_{DD}$, while the other line is held at the low level, such as ground potential GND.

Precharge circuit 20 is composed of PMOS transistors PT1, PT2, PT3, PT4, and P3. Of these transistors, transistor P3 is a so-called low-threshold-voltage transistor with the absolute value of the threshold voltage less than that of conventional PMOS transistors PT1 and PT2. In the following, transistors with the conventional threshold voltage will be referred to as conventional transistors or high-threshold-voltage transistors.

Transistor PT1 is connected between power source voltage $V_{DD}$ and complementary bit line BLB, and its gate is connected to bit line BL. Transistor PT2 is connected between power source voltage $V_{DD}$ and bit line BL, and its gate is connected to complementary bit line BLB. Transistor PT3 is connected between power source voltage $V_{DD}$ and bit line BL. Transistor PT4 is connected between power source voltage $V_{DD}$ and complementary bit line BLB.

Also, transistor P3 is connected between bit line BL and complementary bit line BLB. All of the gates of transistors P3, PT3, and PT4 are connected to precharge signal line PRE.

In write mode, because precharge signal line PRE is held at the high level, transistors P3, PT3, and PT4 are turned off. In this case, as explained above, corresponding to the write data, transistor NT1 or NT2 is turned on. Consequently, either bit line BL or complementary bit line BLB is held at ground potential GND. For example, suppose bit line BL is at ground potential GND, transistor PT1 is on, so that complementary bit line BLB is held at the level of power source voltage $V_{DD}$.

In read mode, before word line WL is activated, precharge signal line PRE is held at the low level. As a result, transistors PT3, PT4 and P3 are on. Consequently, both bit line BL and complementary bit line BLB are precharged to power source voltage $V_{DD}$. After precharge signal line PRE recovers to the high level, word line WL is activated. For example, a pulse at the low level is applied to word line WL. Thus, both transistors P1 and P2 of memory cell 30 are on, and, corresponding to the polarization states of capacitors FC1 and FC2, there is a minute difference in potential generated between bit line BL and complementary bit line BLB. This potential difference is amplified by cross-coupled NMOS transistors N1 and N2 of memory cell 30 as will be explained in detail. Data stored in memory cell 30 is read out on bit line BL and complementary bit line BLB and amplified by sense amplifier 50. This two-stage amplification is advantageous for high speed memory read operations.

As shown in FIG. 2, PMOS transistor PT5 is connected between bit line BL and output node ND3 of sense amplifier 50, and PMOS transistor PT6 is connected between complementary bit line BLB and output node ND4 of sense amplifier 50. The gates of transistors PT5 and PT6 are connected to sense amplifier enable signal line SAE. In read mode, sense amplifier enable signal line SAE is initially at a low level. Consequently, transistors PT5 and PT6 are turned on, the potential of bit line BL is transferred to output node ND3, and the potential of complementary bit line BLB is sent to output node ND4.

Precharge circuit 40 is composed of PMOS transistors P4, P5 and P6. Transistor P4 is connected between power source voltage $V_{DD}$ and node ND3, and transistor P5 is connected between power source voltage $V_{DD}$ and node ND4. Also, transistor P6 is connected between nodes ND3 and ND4. The gates of transistors P4, P5, and P6 are all connected to precharge signal line PRE.

Transistors P4, P5 and P6 are low-threshold-voltage transistors.

In read mode, as explained above, first, precharge signal line PRE is held at the low level. Corresponding to this state, transistors P4, P5 and P6 are all on. Consequently, nodes ND3 and ND4 are precharged to power source voltage $V_{DD}$.

Sense amplifier 50 is composed of PMOS transistors P7, P8 and NMOS transistors N3, N4 and NT3. Transistor NT3 is a transistor having a conventional threshold voltage, and transistors P7, P8 and N3, N4 are low-threshold-voltage transistors.

Transistors P7 and N3 form an inverter, and transistors P8 and N4 form another inverter. These inverters have their inputs and outputs connected alternately to each other to form a latch circuit. The connection point between drains of transistors P7 and N3 is connected to output node ND3 of the sense amplifier, and the connection point between drains of transistors P8 and N4 is connected to output node ND4 of the sense amplifier.

Transistor NT3 is connected between the sources of transistors N3 and N4 of inverter and ground potential GND. The gate of transistor NT3 is connected to sense amplifier enable signal line SAE.

In read mode, since a low-level pulse is applied to sense amplifier enable signal line SAE, transistors PT5 and PT6 are on, the potential of bit line BL is sent to node ND3, and the potential of complementary bit line BLB is sent to node ND4. Consequently, the potential difference between bit line BL and complementary bit line BLB is sent to node ND3 and node ND4. Then, after sense amplifier enable signal line SAE is switched to the high level, transistor NT3 on the ground side of sense amplifier 50 is on, and sense amplifier 50 operates. As a result, the potential difference between node ND3 and node ND4 is amplified. Consequently, either node ND3 or node ND4 is held at power source voltage $V_{DD}$, while the other node is held at ground potential GND.

By means of output buffer 60, the potential of node ND3 is logically inverted to become output signal D0 for output. Also, by means of output buffer 70, the potential of node ND4 is logically inverted to become output signal DOB for output.

As shown in FIG. 2, in the ferroelectric memory of this embodiment, memory cell 30, sense amplifier 50, precharge circuit 40 and output buffers 60, 70 are mainly made up of low-threshold-voltage transistors. Consequently, it is possible to realize higher speed memory access. In order to suppress the leakage current in the standby state, in sense amplifier 50 and output buffers 60, 70, conventional threshold voltage transistors NMOS transistors NT3, NT4, NT5 are connected in series, respectively. Also, in input buffer 10 and precharge circuit 20, transistors NT1, NT2, and transistors PT1–PT6 are made up of transistors having conventional threshold voltage. Consequently, the leakage current of transistors in standby state can be reduced, and power consumption is thus decreased.

In the following, the write and read operations of the ferroelectric memory of this embodiment with reference to the figures will be examined below.

Figure 3:
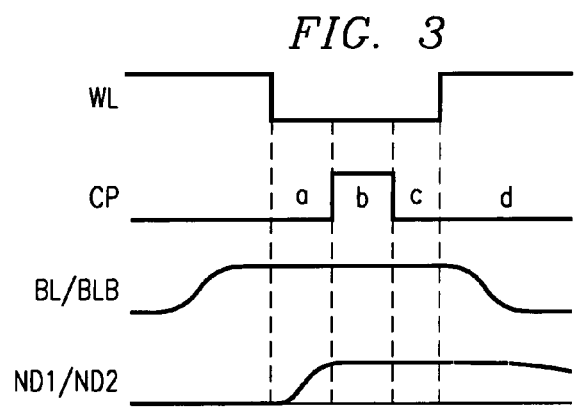
FIG. 3 is a waveform diagram illustrating the write operation of the ferroelectric memory.
Figure 4:
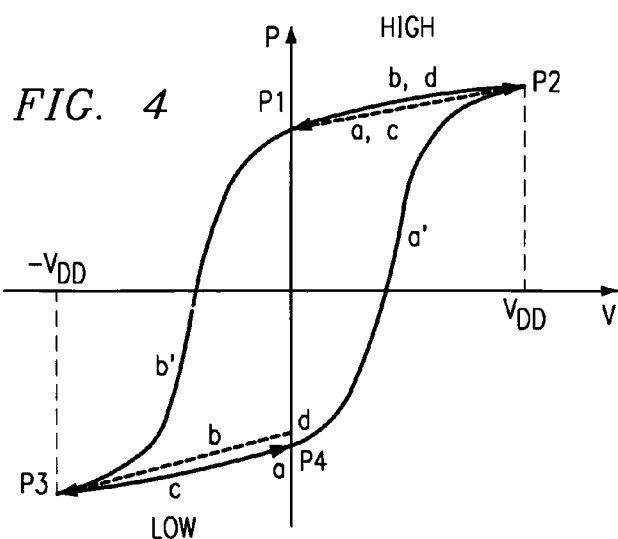
FIG. 4 is a diagram illustrating transition of the polarization state of the ferroelectric capacitor in write.

FIG. 3 is a waveform diagram illustrating the waveform of the ferroelectric memory signal in write mode. FIG. 4 is a graph illustrating the polarization state of the ferroelectric capacitor in said write mode. In the following, let's look at the write operation of the ferroelectric memory with reference to FIGS. 3 and 4.

As shown in FIG. 3, in write mode, first, bit line BL and complementary bit line BLB are held at a voltage level corresponding to the write data. When the voltage level of bit line BL and complementary bit line BLB is established, selected word line WL is activated (that is, is held at the low level). Corresponding to this state, switching transistors P1 and P2 of the memory cell connected to selected word line WL are on. Consequently, the potential at bit line BL is applied to memory node ND1 of the memory cell, and the potential of complementary bit line BLB is applied to memory node ND2 of the memory cell.

After the potential on node ND1 and node ND2 is established, a positive pulse signal is applied to cell plate CP. Corresponding to this state, polarization of capacitors FC1 and FC2 takes place corresponding to the potentials of node ND1 and node ND2, respectively.

In the following, let's look at the change in the polarization states of capacitors FC1 and FC2 with reference to FIG. 4.

In FIG. 4, curves a, b, c and d correspond to periods a, b, c and d in FIG. 3, respectively. Curves a, b, c and d indicate the case when the data written in the memory cell is in agreement with the default stored data, that is, when no polarity inversion takes place for ferroelectric capacitors FC1 and FC2. On the other hand, curves a', b', c' and d' indicate the case when the data written in the memory cell is different from the default stored data, that is, when a polarity inversion takes place for ferroelectric capacitors FC1 and FC2. These cases will be examined below.

First, let's look at the case when no polarity inversion takes place in the ferroelectric capacitors.

As shown in the figure, in period a when a pulse is applied to cell plate CP, for example, due to the last write cycle, residual polarization $P_r$ is left on the ferroelectric capacitor, that is, it is in state at point $P_1$ in FIG. 4.

During period a, cell plate CP is held at the low level. In this case, for example, because an electric field is applied across the ferroelectric capacitor connected to the memory node that is held at the high level corresponding to the write data, polarization occurs. That is, as a result of application of an electric field to the ferroelectric capacitor as shown in FIG. 4, the polarization state changes from point $P_1$ to point $P_2$.

During period b, cell plate CP is held at the high level. In this case, for example, an electric field is applied across the ferroelectric capacitor connected to the memory node that is held at the low level corresponding to the write data. As a result, polarization occurs.

That is, during period a, a write operation is performed on the ferroelectric capacitor connected to the memory node at the high level. During period b, the write operation is performed on the ferroelectric capacitor connected to the memory node on the low level.

Then, during period c, cell plate CP is held at the low level. This state is similar to said period a, and an electric field is applied to the ferroelectric capacitor connected to the memory node held at the high level. Consequently, a write operation is performed again on the capacitor connected to the memory node on the high level. On the other hand, no electric field is applied to the electrode of the ferroelectric capacitor connected to the memory node held at the low level, and polarization does not take place.

During period d, due to the leakage current of the transistors, the charge at the memory node held at the high level during the write period escapes, and the voltage of the memory node gradually falls to the low level. In this case, the electric field applied to the electrode of the ferroelectric capacitor becomes 0. Yet due to the hysteresis characteristics of the ferroelectric capacitor, a residual polarization remains (point $P_1$ in FIG. 4).

As explained above, during the write operation, an electric field is applied to the ferroelectric capacitor corresponding to the write data. As a result, polarization remains corresponding to the write data on the ferroelectric capacitor. Due to the residual polarization, the write data is stored. Also, in a single ferroelectric memory cell, of the two ferroelectric capacitors FC1 and FC2, a positive polarization remains on one capacitor, while a negative polarization remains on the other capacitor, corresponding to the stored data. Even when the power source to the memory cell is turned off after write, the polarization state of the ferroelectric capacitor is left. Consequently, the write data is kept without damage.

In the following, let's look at the operation when a polarization inversion takes place for the ferroelectric capacitor corresponding to the write data. When a data different from the data being stored in the memory cell is written, the polarity of the ferroelectric capacitor is inverted, that is, a so-called polarization inversion takes place.

For example, residual polarization $P_r$ remains on the ferroelectric capacitor corresponding to the stored data in the memory cell before a write operation, and the state is at point $P_1$ in FIG. 4. In this case, although during the last write cycle, the memory node was held at, e.g., the high level, in the present write cycle, the memory node is held at the low level corresponding to the write data. Consequently, during period a shown in FIG. 3, cell plate CP is held at the low level, and no electric field is applied to the electrode of the ferroelectric capacitor connected to the memory node.

During period b, cell plate CP is held at the high level. Consequently, an electric field is applied to the ferroelectric capacitor. Corresponding to this state, polarization inversion takes place for the ferroelectric capacitor. That is, in FIG. 4, the state of ferroelectric capacitor moves along curve b' from point $P_1$ to point $P_3$.

That is, when data different from the data being stored in the ferroelectric memory cell is written, polarization inversion takes place in the ferroelectric capacitor of the memory cell. Consequently, due to the write operation, a data different from the stored data of the last write cycle is written to the ferroelectric memory cell. After the end of write operation, the electric field applied to the ferroelectric capacitor becomes 0, and polarization remains on the ferroelectric capacitor, and the write data is held. That is, in FIG. 4, the ferroelectric capacitor becomes the state indicated by point $P_4$. In this case, the residual polarization of ferroelectric capacitor has a polarity opposite to that of the state indicated by point $P_1$. For example, suppose the residual polarization at point $P_1$ is $P_r$, then the residual polarization in this case becomes $-P_r$.

In the following, let's look at the read operation of the ferroelectric memory in this embodiment with reference to FIGS. 5 and 6.

Figure 5:
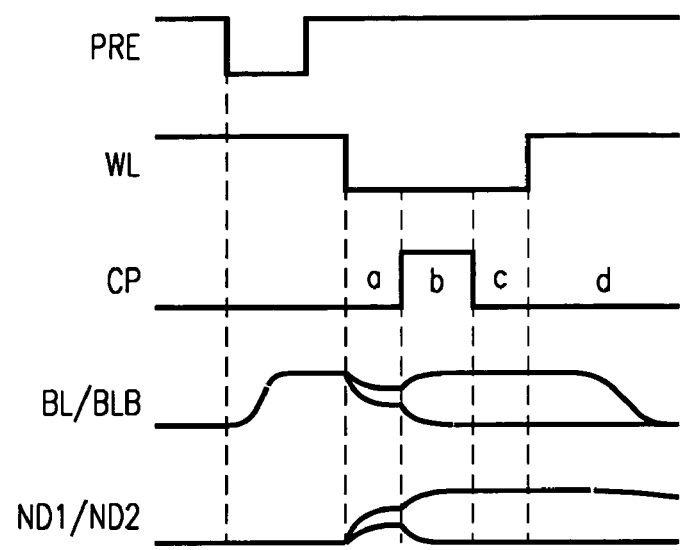
FIG. 5 is a waveform diagram illustrating the read operation of the ferroelectric memory.
Figure 6:
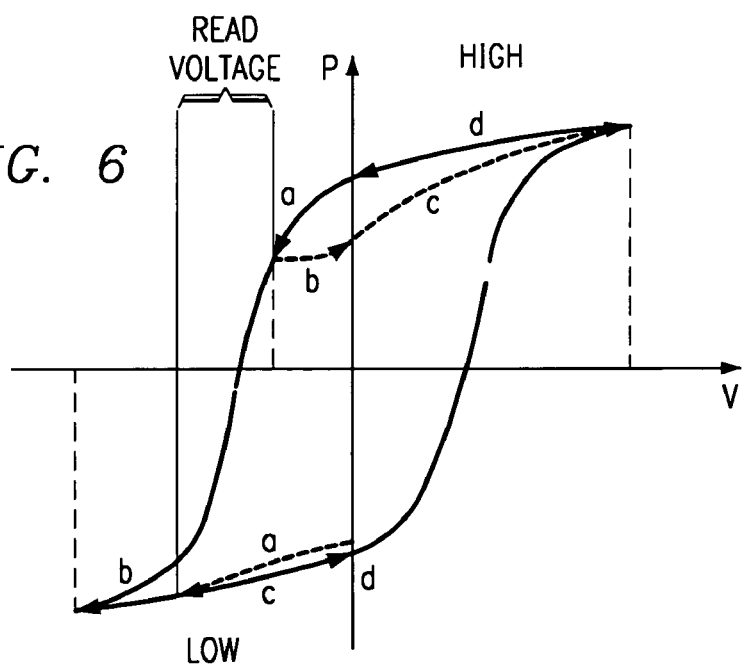
FIG. 6 is a diagram illustrating transition of the polarization state of the ferroelectric capacitor in a read operation.

FIG. 5 is a waveform diagram illustrating the waveform of the ferroelectric memory during the read operation. FIG. 6 is a graph illustrating change in the polarization state of the ferroelectric capacitor during the read operation.

As shown in FIG. 5, in the read operation, first, a negative pulse is applied to precharge signal line PRE. Corresponding to this state, the precharge circuit operates, and bit line BL and complementary bit line BLB are precharged to, e.g., power source voltage $V_{DD}$. After precharging, word line WL is activated at a low level. Consequently, switching transistors P1 and P2 of the memory cell are on, and memory nodes ND1 and ND2 are connected to bit line BL and complementary bit line BLB, respectively.

As a result, re-distribution of the precharged charge takes place between bit line BL and memory node ND1 and between complementary bit line BLB and memory node ND2. At this time, because capacitors FC1 and FC2 are polarized in opposite directions, there is a difference between their effective capacitances due to their residual polarization. After re-distribution of the charge, a difference in potential (read voltage in FIG. 6) takes place between bit line BL and complementary bit line BLB.

During period b, a pulse at the high level is applied to cell plate CP. Corresponding to this state, re-writing of data is performed on the memory cell. In this case, an electric field is applied to the electrode of the ferroelectric capacitor connected to the memory node held at the low level, so that re-writing of data is performed. Furthermore, capacitive coupling through capacitors FC1 and FC2 increases the voltage at memory nodes ND1 and ND2 (FIG. 1). Cross-coupled transistors N1 and N2 amplify the difference voltage at memory nodes ND1 and ND2. For example, if memory node ND1 is positive with respect to memory node ND2, the gate of transistor N2 is more positive than the gate of transistor N1. Thus, transistor N2 is more conductive and pulls memory node ND2 low, thereby further reducing the conductivity of transistor N1 and amplifying the difference voltage. This amplified difference voltage is applied to bit line BL and complementary bit line BLB via transistors P1 and P2 and, subsequently, amplified by a sense amplifier 50 (FIG. 2). Consequently, it is possible to read the stored data of the memory cell at a high speed by two stage amplification.

During period c, cell plate CP is held at the low level. In this case, an electric field is applied to the electrode of the ferroelectric capacitor connected to the memory node held on the high level, so that re-writing of data is performed.

As explained above, during periods b and d, re-writing of data is carried out for ferroelectric capacitor. By means of this re-writing, a change in the residual polarization of the ferroelectric capacitor due to reading of data is corrected, and the stability of the ferroelectric memory is improved.

During period d, the potential of word line WL is held at the high level. Consequently, bit line BL and complementary bit line BLB are cut off from the memory cell, and the power source to the memory cell is turned off. Due to leakage current of transistors N1 and N2, the potential of the memory node gradually drops to ground potential GND. However, since the polarization characteristics of the ferroelectric capacitor are kept, the stored data is held without damage.

FIG. 7 is a layout diagram illustrating the layout of the memory array formed using the ferroelectric memory cells of this embodiment.

As shown in the figure, the memory array is composed of precharge circuit 100, memory block 110, row decoder 120, sense amplifier array 130, and local word line drivers 140-1, 140-2, 140-3, and 140-4.

Memory block 110 is composed of plural memory blocks. For example, in the example shown in FIG. 7, it is composed of 8 memory blocks MB1–MB8.

For example, for precharge circuit 100, bit line BL and complementary bit line BLB of the selected memory block are precharged.

Row decoder 120 drives global word line GWL. Also, as shown in FIG. 7, the word lines are formed in a hierarchical structure, and local word lines LWL are driven by local word line drivers 140-1, 140-2 . . . 140-4 that operate corresponding to the signals of global word line GWL and block selecting signal line BSEL (not shown in the figure) arranged in each memory block. For example, each local word line is connected to 16-bit memory cell in a DSP that takes 16 bits as a word.

As shown in the figure, for the memory configuration with a hierarchical design for the memory and having a block structure, in the standby state, bit line BL and complementary bit line BLB drop to ground potential GND, so that supply of power source to the memory cell is shut down. As a result, the power consumption in the standby state due to the leakage current of transistors and that during operation are minimized, and a lower power consumption can be realized.

FIG. 8 is a diagram illustrating an example of local word line driver 140 that drives local word line corresponding to the signals of global word line GWL and block selection signal line BSEL.

In order to select local word line LWL, NAND gate NG is set for each local word line. One of the input terminals of NAND gate NG is connected to global word line GWL, and the other input terminal is connected to block selecting signal line BSEL.

Global word line GWL is driven with the row decoder. In this case, global word line GWL and block selection signal line BSEL work with positive logic. That is, when not selected, global word line GWL and block selecting signal line BSEL are held at the low level; and, when selected, global word line GWL and block selecting signal line BSEL are held at the high level.

Consequently, when selected, local word line LWL is held at the low level, switching transistors P1 and P2 of the memory cell connected to the local word line are on, and it is possible to perform data write or read for the memory cell.

Figure 9:
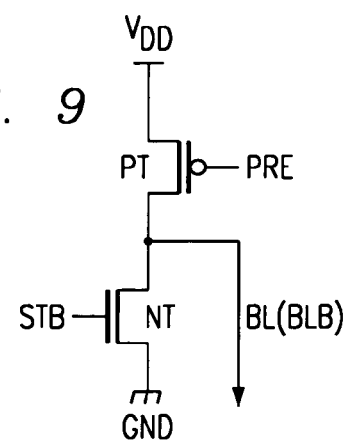
FIG. 9 is a circuit diagram illustrating an example of the bit line precharge and ground circuit.

FIG. 9 illustrates the circuit for precharge and grounding of bit line BL and complementary bit line BLB.

As shown in the figure, bit line BL or complementary bit line BLB is connected via PMOS transistor PT to power source voltage $V_{DD}$, or via NMOS transistor NT to ground. The gate of transistor PT is connected to precharge signal line PRE, and the gate of transistor NT is connected to standby signal line STB. Consequently, when precharge signal line PRE is at the low level, transistor PT is on. On the other hand, when standby signal line STB is at the high level, transistor NT is on.

Since PMOS transistor PT is on, bit line BL or complementary bit line BLB is kept at power source voltage $V_{DD}$. On the other hand, since NMOS transistor NT is on, bit line BL or complementary bit line BLB is held at ground potential.

In standby mode, power consumption takes place due to the leakage current that flows through transistor PT for precharging. This leakage current may be reduced by means of gate bias control using a super-cutoff system or by means of control of the potential of power source voltage $V_{DD}$. In said super-cutoff system, a PMOS transistor with a low threshold voltage is set in the current supply path of a functional circuit made of MOS transistors with a low threshold voltage, such as a logic circuit that performs the prescribed logic operation. In the standby state of the logic circuit, a voltage higher than the power source voltage is applied to the gate of said PMOS transistor, so that said PMOS transistor is set to fully off state. As a result, the current path is cut off, and the leakage current of the MOS transistor with a low threshold voltage is reduced.

Figure 10A:
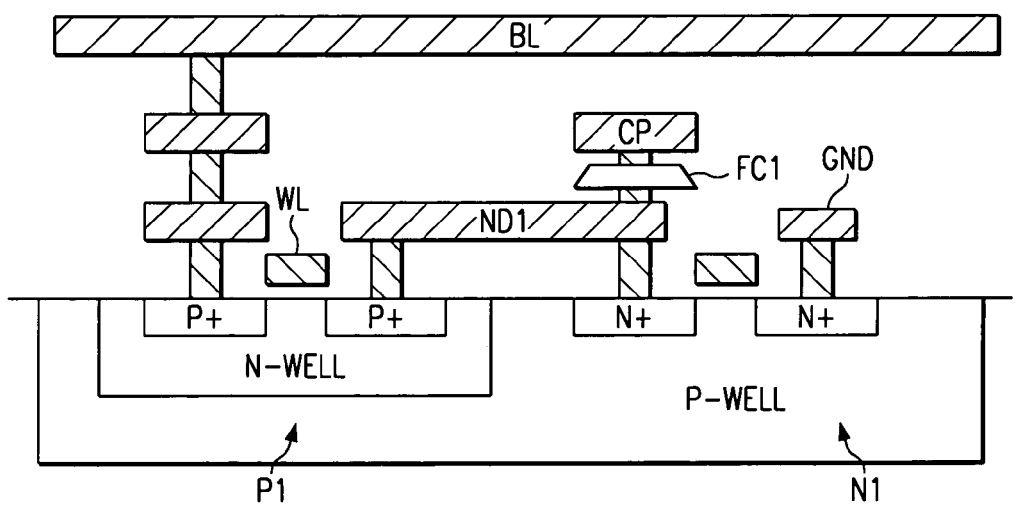
FIG. 10A is a cross-sectional view of the ferroelectric memory cell.
Figure 10B:
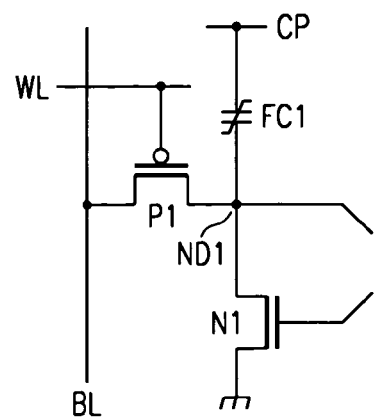
FIG. 10B is a schematic diagram of the ferroelectric memory cell of FIG. 10A.

FIG. 10A is a schematic cross-sectional view illustrating the ferroelectric memory cell in this embodiment. In FIG. 10B, the circuit of the portion of the memory cell corresponding to the cross-sectional view shown in FIG. 10A is shown.

As shown in FIG. 10A, on a semiconductor substrate, PMOS transistor P1 and NMOS transistor N1 for amplification are formed, respectively. The gate of PMOS transistor P1 is formed with word line WL. On the metal wiring layer formed on word line WL, memory node ND1 is formed. In addition, a ferroelectric capacitor is formed on the metal wiring layer.

On the ferroelectric capacitor, cell plate CP is formed. On this cell plate, bit line BL and complementary bit line BLB are formed.

As shown in FIG. 10A, because the ferroelectric capacitor is formed in the upper portion of the circuit, the area of the ferroelectric capacitor is much smaller than that of the conventional SRAM. Consequently, it is believed that the area of the memory cell is similar to that of a 4-transistor SRAM.

Examples of ferroelectric materials include PZT (lead titanium zirconate, $Pb(Zr, Ti)O_3$). For the ferroelectric memory cell in this embodiment, ferroelectric capacitors are formed in the upper portion of SRAM from ferroelectric material. Ferroelectric material PZT must be sintered at high temperature, such as 600° C. or more. However, in the wiring process using copper, because the melting point of copper is 1000° C. or higher, it can well withstand the heat treatment for sintering the ferroelectric material. Also, in the conventional process using aluminum, for example, one may change the material of the lowermost layer, that is, a metal wiring layer (MET1), to tungsten (W), so that the process can withstand the heat treatment.

As shown in FIG. 1, switching transistors P1, P2 are transistors having a low threshold voltage. Cross-coupled NMOS transistors N1 and N2 are transistors having a conventional threshold voltage, and a power source voltage is applied at all times. In this case, due to the leakage current of switching transistors P1 and P2, charge is replenished to accumulation nodes ND1 and ND2.

As explained above, the ferroelectric memory of the present invention is formed with a structure similar to that of SRAM using ferroelectric capacitors. Consequently, while high-speed data access is realized, lower voltage and lower power consumption are also realized. In addition, it is possible to realize nonvolatile storage of data, with improved reliability and stability. These are the advantages of the present invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. For example, the embodiments described at FIG. 2 describe a single power supply voltage $V_{DD}$ for both the memory array and the peripheral circuits such as the row decoder. It will be appreciated that different power supply voltages having different magnitudes or polarities will benefit from the techniques described. Further, it will be appreciated that the relative logic levels (low or high) chosen in the embodiments may be reversed with corresponding changes to the logic circuitry and still preserve the functions described. It is therefore intended that the appended claims encompass any such modifications or embodiments.

What is claimed is:

1. A method of making a memory circuit comprising the steps of:
   coupling a first capacitor between a first terminal and a common terminal;
   coupling a second capacitor between a second terminal and the common terminal;
   coupling a first transistor having a current path between the first terminal and a reference terminal and having a control terminal coupled to the second terminal; and
   coupling a second transistor having a current path between the second terminal and the reference terminal and having a control terminal coupled to the first terminal,
   wherein each of the first and send capacitor is a ferroelectric capacitor.

2. The method of claim 1, wherein each of the first and second capacitor comprises a lead titanium zirconate (PZT) dielectric.

3. A method of making a memory circuit comprising the steps of:
   coupling a first capacitor between a first terminal and a common terminal;
   coupling a second capacitor between a second terminal and the common terminal;
   coupling a first transistor having a current path between the first terminal and a reference terminal and having a control terminal coupled to the second terminal;
   coupling a second transistor having a current path between the second terminal and the reference terminal and having a control terminal coupled to the first terminal, and
   a precharge circuit that precharges the bit line and the complementary bit line to a predetermined voltage before a memory access.

4. The method of claim 3, wherein the precharge circuit precharges the bit line and the complementary bit line to a reference voltage having a magnitude less than a magnitude of the predetermined voltage during a standby mode.

5. The method of claim 3, wherein the precharge circuit comprises:
   a first precharge transistor having a current path arranged to apply the predetermined voltage to the bit line and having a control terminal coupled to receive a control voltage having a magnitude greater than a magnitude of the predetermined voltage; and a second precharge transistor having a current path arranged to apply the predetermined voltage to the complementary bit line and having a control terminal coupled to receive the control voltage.

6. A method of making a memory circuit comprising the steps of:
coupling a first capacitor between a first terminal and a common terminal;
coupling a second capacitor between a second terminal and the common terminal;
coupling a first transistor having a current path between the first terminal and a reference terminal and having a control terminal coupled to the second terminal;
coupling a second transistor having a current path between the second terminal and the reference terminal and having a control terminal coupled to the first terminal, and
a first voltage supply circuit that selectively applies a reference voltage and a prescribed voltage to the common terminal.

7. A method of making a memory circuit comprising the steps of:
coupling a first capacitor between a first terminal and a common terminal;
coupling a second capacitor between a second terminal and the common terminal;
coupling a first transistor having a current path between the first terminal and a reference terminal and having a control terminal coupled to the second terminal;
coupling a second transistor having a current path between the second terminal and the reference terminal and having a control terminal coupled to the first terminal;
coupling a third transistor having a current path between the first terminal and a bit line and having a control terminal coupled to a word line; and
coupling a fourth transistor having a current path between the second terminal and a complementary bit line and having a control terminal connected to the word line,
wherein a prescribed voltage is applied in pulse form to the common terminal when the word line turns on the third and fourth transistors.

8. A method of making a memory circuit, comprising the steps of:
providing a plurality of columns of memory cells, each column having a bit line and a complementary bit line, each memory cell connected to a respective bit line and a respective complementary bit line, each memory cell having a first capacitor connected between a respective first terminal and a common terminal and having a second capacitor connected between a respective second terminal and the common terminal; and
providing a plurality of rows of memory cells, each row having a global word line selectively connected to a plurality of local word lines, each local word line coupled to at least one memory cell.

9. The method of claim 8, wherein each memory cell comprises:
a first transistor having a current path connected between the first terminal and a reference terminal and having a control terminal connected to the second terminal, and
a second transistor having a current path connected between the second terminal and the reference terminal and having a control terminal connected to the first terminal.

10. The method of claim 8, wherein each of the first and second capacitor is a ferroelectric capacitor.

11. The method of claim 8, wherein each of the first and second capacitor comprises a lead titanium zirconate (PZT) dielectric.

12. The method of claim 8, wherein each memory cell comprises:
a third transistor having a current path connected between the first terminal and a respective bit line and having a control terminal connected to a respective local word line; and
a fourth transistor having a current path connected between the second terminal and a respective complementary bit line and having a control terminal connected to a respective local word line.

13. The method of claim 8, wherein each column comprises a precharge circuit that precharges the respective bit line and complementary bit line to a predetermined voltage before a memory access.

14. The method of claim 13, wherein the precharge circuit precharges the respective bit line and complementary bit line to a reference voltage having a magnitude less than a magnitude of the predetermined voltage during a standby mode.

15. The method of claim 13, wherein the precharge circuit comprises;
a first precharge transistor having a current path arranged to apply the predetermined voltage to the respective bit line and having a control terminal coupled to receive a control voltage having a magnitude greater than a magnitude of the predetermined voltage; and
a second precharge transistor having a current path arranged to apply the predetermined voltage to the respective complementary bit line and having a control terminal coupled to receive the control voltage.

16. The method of claim 8, further comprising a first voltage supply circuit that selectively applies a reference voltage and a prescribed voltage to the common terminal.

17. The method of claim 12, wherein a prescribed voltage is applied in pulse form to the common terminal when the word line turns on the third and fourth transistors.

* * * * *